(12) United States Patent
Liu et al.

(10) Patent No.: US 9,431,514 B2
(45) Date of Patent: Aug. 30, 2016

(54) FINFET DEVICE HAVING A HIGH GERMANIUM CONTENT FIN STRUCTURE AND METHOD OF MAKING SAME

(71) Applicants: STMicroelectronics, Inc., Coppell, TX (US); International Business Machines Corporation, Armonk, NY (US)

(72) Inventors: Qing Liu, Watervliet, NY (US); Bruce Doris, Slingerlands, NY (US); Gauri Karve, Fishkill, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/577,316

(22) Filed: Dec. 19, 2014

(65) Prior Publication Data

US 2016/0181395 A1  Jun. 23, 2016

(51) Int. Cl.

| | |
|---|---|
| H01L 21/335 | (2006.01) |
| H01L 29/66 | (2006.01) |
| H01L 29/78 | (2006.01) |
| H01L 29/417 | (2006.01) |
| H01L 29/423 | (2006.01) |
| H01L 21/306 | (2006.01) |
| H01L 21/02 | (2006.01) |

(52) U.S. Cl.
CPC ... *H01L 29/66545* (2013.01); *H01L 21/02057* (2013.01); *H01L 21/30604* (2013.01); *H01L 29/41783* (2013.01); *H01L 29/4236* (2013.01); *H01L 29/6656* (2013.01); *H01L 29/66795* (2013.01); *H01L 29/785* (2013.01)

(58) Field of Classification Search
CPC .................. H01L 29/66545; H01L 29/41783; H01L 29/4236; H01L 29/6656; H01L 29/66795; H01L 29/785; H01L 21/02057; H01L 21/30604
USPC .......................... 438/142, 154, 157, 199, 300
See application file for complete search history.

(56) References Cited

U.S. PATENT DOCUMENTS

| | | | |
|---|---|---|---|
| 9,082,852 B1* | 7/2015 | Liu ....................... | H01L 29/785 |
| 2014/0065774 A1* | 3/2014 | Chang ................. | H01L 29/7848 438/157 |
| 2015/0137193 A1* | 5/2015 | Cheng ................. | H01L 29/7842 257/288 |
| 2015/0311340 A1* | 10/2015 | Ma .................... | H01L 29/66636 257/336 |

* cited by examiner

*Primary Examiner* — Kevin M Picardat
(74) *Attorney, Agent, or Firm* — Gardere Wynne Sewell LLP

(57) ABSTRACT

A fin of silicon-germanium material is formed and covered with an epitaxially grown layer of silicon material. A dummy transistor gate is then formed to extend over a channel of the fin. Sidewall spacers are formed on each side of the dummy transistor gate and directly on top of the expitaxial silicon layer. Epitaxially grown raised source and drain regions are formed on each side of the dummy transistor gate adjacent the sidewall spacers. The dummy transistor gate and a portion of the epitaxial silicon layer (underneath said dummy transistor gate) are removed and replaced by a metal gate.

21 Claims, 13 Drawing Sheets

FINFET DEVICE HAVING A HIGH GERMANIUM CONTENT FIN STRUCTURE AND METHOD OF MAKING SAME

TECHNICAL FIELD

The present invention relates to the fabrication of integrated circuits and, more particularly, to a process for the formation of FinFET-type integrated circuit devices and a FinFET device produced by such a process.

BACKGROUND

A FinFET transistor utilizes a channel region which is oriented to conduct an electrical current parallel to the surface of the substrate. The channel region is provided in an elongated section of semiconductor material referred to in the art as a "fin." The source and drain regions of the transistor are typically also formed in or on the elongated section on each side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions separated from each other by an intermediate gate portion, where the transistor gate spans with a perpendicular orientation over the multiple elongated sections.

Those skilled in the art understand the advantage of utilizing a silicon-germanium (SiGe) material for the formation of fins to be used in p-channel transistor devices. For example, SiGe material is preferred because it introduces compressive strain in the channel region of the transistor which results in improved mobility and device performance.

The amount of induced strain is, generally speaking, proportional to the level of germanium content within the SiGe fin material. It is recognized by those skilled in the art to provide as high a percentage of germanium as possible. For example, germanium content in excess of 25% is desired.

It is not technically difficult to produce silicon germanium semiconductor materials having a germanium content in excess of 25%. Well known epitaxial growth and thermal condensation techniques can be used to make such a material. The technical challenge, however, arises when attempting to shape the silicon germanium material into the fin of the FinFET device. The fabrication of the fin and the making of the FinFET device utilize a number of different etch and clean processes. Those skilled in the art recognize that the higher the germanium content of the silicon-germanium material, the more vulnerable that material may be to undesired consumption during fabrication processing. For example, the standard wet clean process (referred to by those skilled in the art as "SC1") utilized in semiconductor manufacturing will consume silicon-germanium material at a faster rate relative to the germanium content proportion. This makes it difficult to maintain a consistent fin size, especially in comparison to the silicon material used for fin fabrication of n-channel devices located on the same wafer.

There is accordingly a need in the art for a method to support the fabrication of fins in FinFET devices made of silicon germanium with a relatively high (for example, greater than 25%) germanium content.

SUMMARY

In an embodiment, a method for manufacturing a FinFET transistor comprises: forming a fin of silicon-germanium semiconductor material; forming a layer of silicon material on surfaces of said fin; forming a transistor gate structure that extends over a channel region of said fin; forming sidewall spacers on each side of the transistor gate structure, wherein a bottom of each sidewall spacer is separated from a top surface of said fin by said layer of silicon material; forming recessed regions at a top of the fin adjacent the channel region on each side of the transistor gate electrode; and epitaxially growing epitaxial growth material from said fin to fill the recessed regions and form raised source and drain regions.

In an embodiment, an integrated FinFET transistor circuit comprises: a fin of silicon-germanium semiconductor material; a transistor gate electrode extending over a channel region of said fin; sidewall spacers on each side of the transistor gate electrode; a layer of silicon material between a bottom of each sidewall spacer and a top surface of the fin; wherein said fin further includes a recessed region on each side of the channel region; and raised source and drain regions of epitaxial growth material filling said recessed regions.

In an embodiment, a method comprises: forming a first fin of first semiconductor material and a second fin of second semiconductor material that is different from the first semiconductor material; covering said first fin with a mask having an opening exposing said second fin; epitaxially growing a layer of silicon material on exposed surfaces of said second fin; forming a dummy transistor gate that extends over a channel region of said second fin; forming sidewall spacers on each side of the dummy transistor gate and directly on top of said layer of silicon material; removing portions of said layer of silicon material on each side of the dummy transistor gate adjacent the sidewall spacers; forming recessed regions in a top surface of the fin where the portions of said layer of silicon material were removed; epitaxially growing raised source and drain regions in said recessed regions; removing the dummy transistor gate; removing another portion of said layer of silicon material underneath said dummy transistor gate; and installing a replacement metal gate between the sidewall spacers.

In an embodiment, a method comprises: forming a fin of silicon-germanium material; epitaxially growing a layer of silicon material on surfaces of said fin; forming a dummy transistor gate to extend over a channel region of said fin; forming sidewall spacers on each side of the dummy transistor gate, said sidewall spacers is direct contact with a top of the layer of silicon material; epitaxially growing raised source and drain regions from said fin on each side of the dummy transistor gate adjacent the sidewall spacers; removing the dummy transistor gate and a portion of the epitaxial silicon layer underneath said dummy transistor gate; and installing a replacement metal gate between the sidewall spacers.

In an embodiment, a method comprises: forming a fin of silicon-germanium material; epitaxially growing a layer of silicon material on surfaces of the fin; forming a dummy transistor gate structure to extend over a channel region of the fin, the dummy transistor gate structure including a dummy gate; forming a gate electrode recess by removing the dummy gate and a portion of the epitaxial layer of silicon material underneath the dummy gate; and installing a replacement metal gate structure over the channel region of the fin in the gate electrode recess.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-11B showing process steps for the formation of an integrated circuit including FinFET devices. It will be understood that the illustrations provided do not necessarily show the features drawn to scale.

Figure 1:
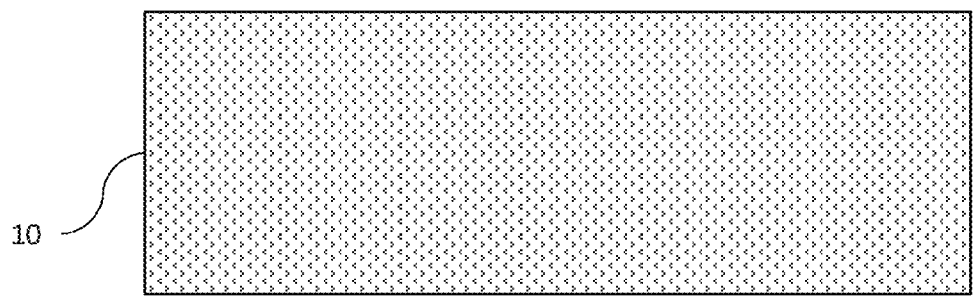
FIGS. 1-11B show process steps for the formation of an integrated circuit including FinFET devices.

The process starts with a substrate 10 as shown in FIG. 1. The substrate 10 may comprise a silicon on insulator (SOI) substrate wafer of a conventional type (including an extremely thin silicon on insulator (ETSOI) or ultra-thin body and buried oxide (UTBB) silicon on insulator (SOI) known to those skilled in the art). Alternatively, the substrate 10 may comprise a bulk semiconductor substrate wafer. The top semiconductor layer of the SOI substrate or the semiconductor material of the bulk substrate may be doped as appropriate for the integrated circuit application (and in the present implementation the substrate material which will eventually be formed into a fin need not be doped at all). In an embodiment of an SOI substrate, the top semiconductor layer may be of the fully depleted (FD) configuration. The bulk substrate may include, for example, a number of epitaxially grown semiconductor layers. The process techniques described herein are equally applicable to SOI and bulk substrates, as well as other types of substrate, and thus a generic representation of the substrate 10 is shown in FIG. 1.

Using fabrication techniques well known to those skilled in the art, a plurality of fins of semiconductor material are formed at the top surface of the substrate 10.

Figure 2A:
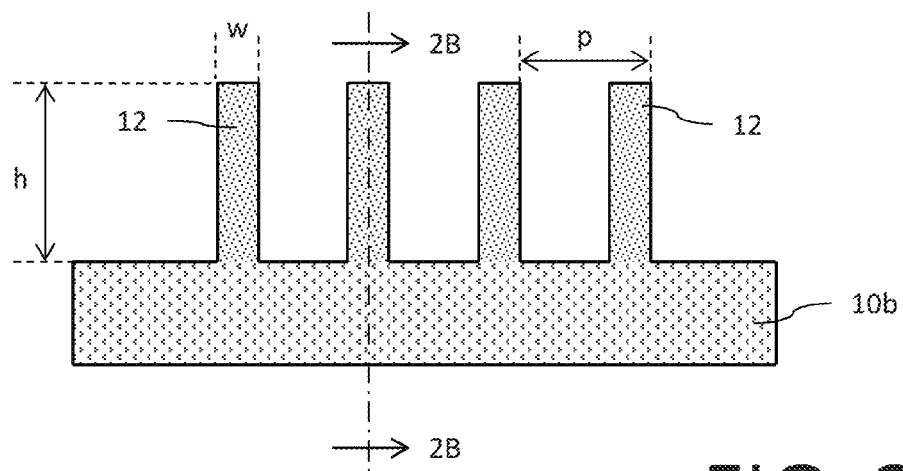
Figure 2B:
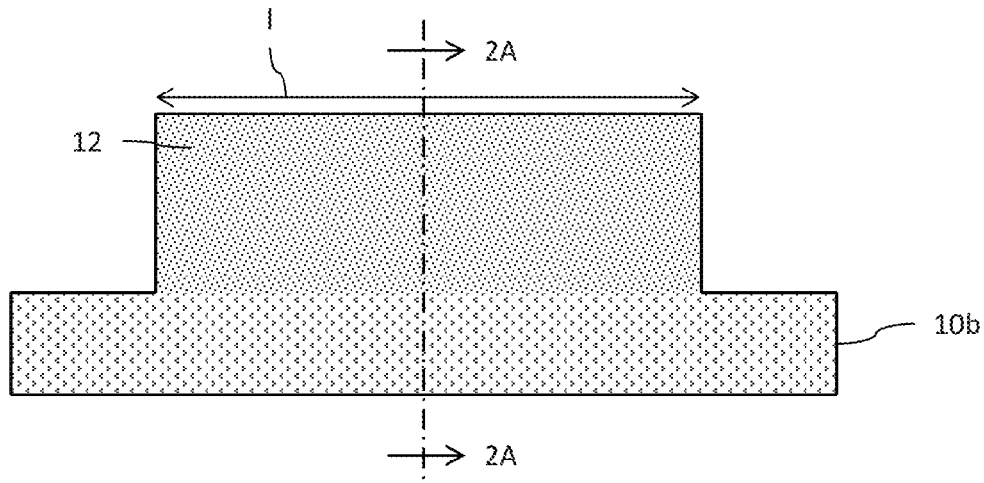

The result of the fin fabrication process using a bulk-type substrate 10b, for example, is shown in cross-sectional FIGS. 2A and 2B, wherein the illustrated orientations of FIGS. 2A and 2B are orthogonal to each other. The individual fins 12 may have a height "h" of 50-200 nm, a width "w" of 6-15 nm and a pitch "p" of 20-50 nm. The length "l" of each fin 12 is determined by the application of the transistor and may, for example, be 0.4-600 µm.

Figure 3A:
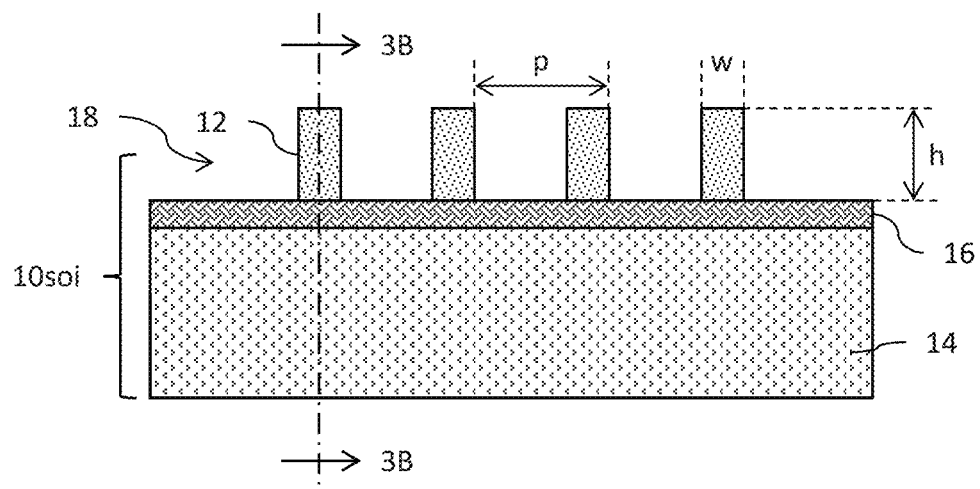
Figure 3B:
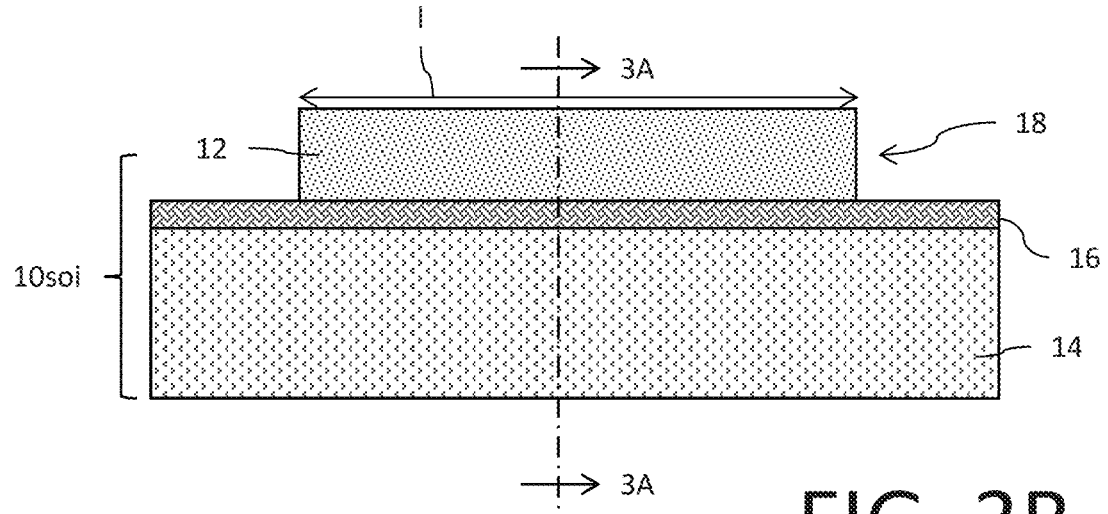

The result of the fin fabrication process using an SOI-type substrate 10soi, for example, is shown in cross-sectional FIGS. 3A and 3B, wherein the illustrated orientations of FIGS. 3A and 3B are orthogonal to each other. The individual fins 12 may have a height "h" of 30-50 nm, a width "w" of 6-15 nm and a pitch "p" of 20-50 nm. The length "l" of each fin 12 is determined by the application of the transistor and may, for example, be 0.4-600 µm. The SOI substrate 10soi may include a substrate layer 14 (for example, made of silicon), a thin oxide layer 16 and an overlying semiconductor layer 18 within which the fins 12 are formed.

In FIGS. 2A-2B and 3A-3B, the illustrated fins 12 are made of a semiconductor material. In a preferred implementation, the fins 12 are made of silicon-germanium and preferably have a relatively high germanium content (for example, in excess of 25% and more preferably in a range of between 25-55% germanium content). The focus here is on silicon-germanium (SiGe) fins 12, and thus fins made of other suitable semiconductor materials, such as silicon, are not explicitly shown in FIGS. 2A-2B and 3A-3B (see, FIGS. 12H and 13J, described herein, for illustration of fins made of other materials), it being understood by those skilled in the art that such fins made of other materials may be provided at other areas of the wafer. The fins 12 may, for example, be doped as appropriate for the integrated circuit application.

Figure 4A:
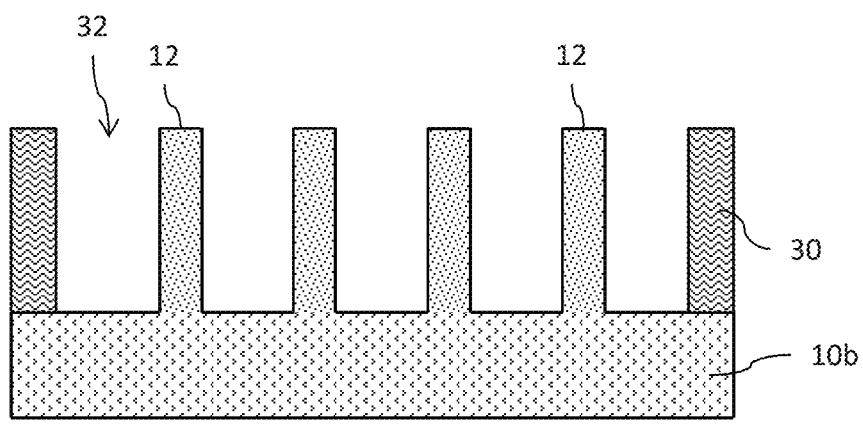
Figure 4B:
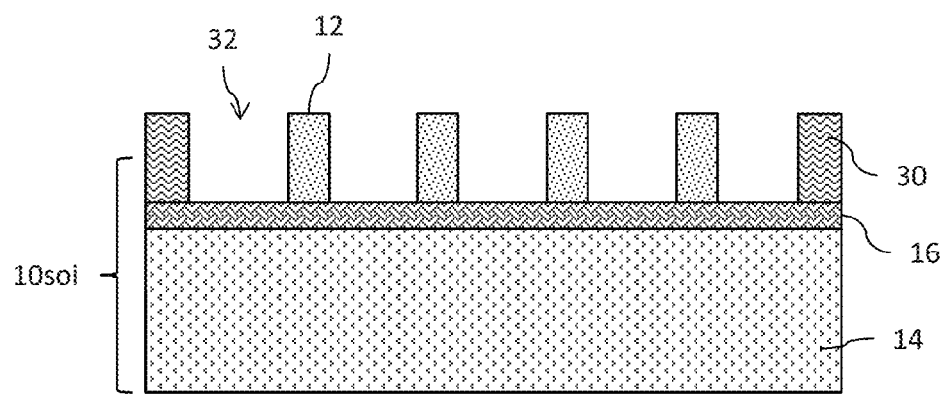

Reference is now made to FIGS. 4A and 4B (where FIG. 4A refers to the implementation on the bulk substrate 10b and FIG. 4B refers to the implementation on the SOI substrate 10soi). A hard mask 30 covers the wafer except at areas where silicon-germanium fins 12 are located (i.e., the mask covers fins made of material other than silicon-germanium). The hard mask 30 has accordingly been lithographically patterned in a manner well known in the art to open apertures 32 exposing the silicon-germanium fins 12. It will be understood that in a typical implementation, the hard mask 30 would thus cover fins made of silicon. In this implementation, it may be considered that the silicon-germanium fins are located in active regions associated with the fabrication of p-channel transistors, while the covered fins made of other materials such as silicon are located in active regions associated with the fabrication of n-channel transistors.

Figure 5A:
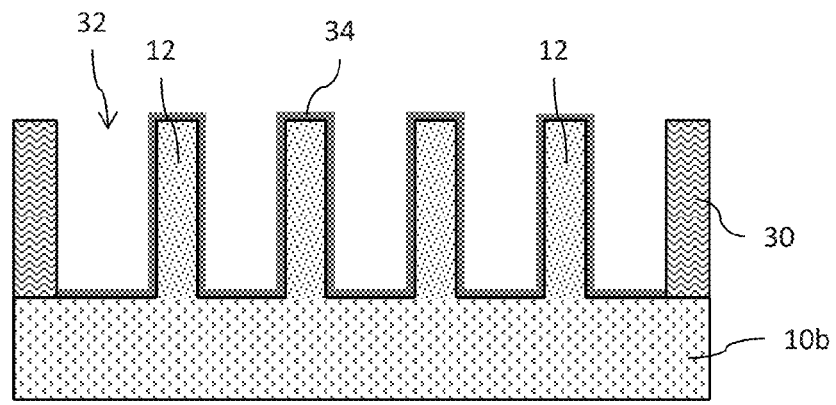
Figure 5B:
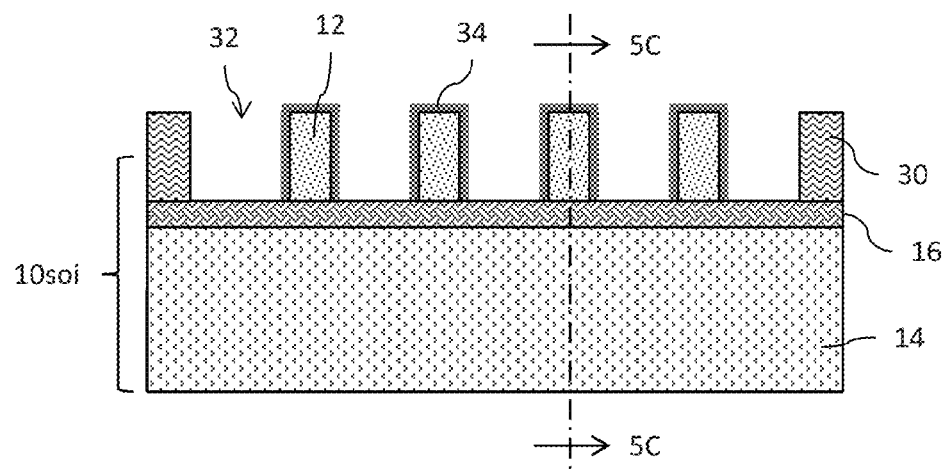
Figure 5C:
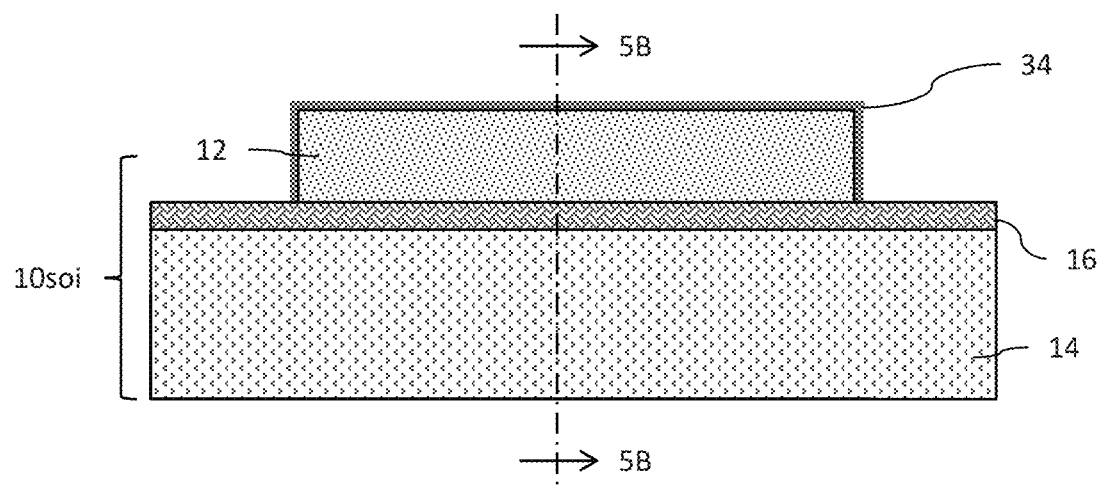

Using an epitaxial process tool, an epitaxial growth of a thin layer 34 of silicon semiconductor material is made. In FIG. 5A, for fins 12 formed on the bulk substrate 10b, the layer 34 of silicon epitaxial growth will cover not only the fins 12 but also the upper surface of the substrate 10b within the aperture 32. In FIG. 5B, for fins formed on the SOI substrate 10soi, the layer 34 of silicon epitaxial growth covers only the fins 12. The epitaxial growth layer 34 may, for example, have a thickness of about 2-4 nm. A cross-section along the length of a fin 12 in FIG. 5B is shown in FIG. 5C.

Figure 6A:
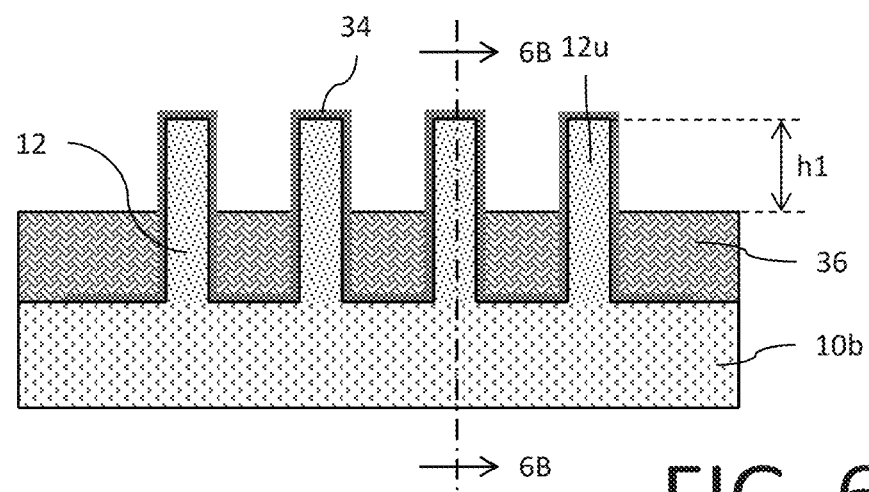
Figure 6B:
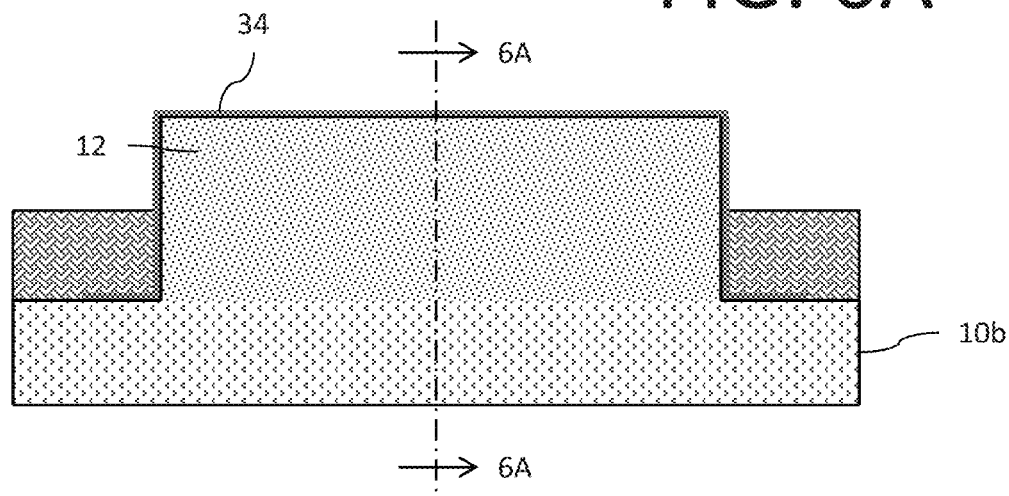

Reference is now made to FIGS. 6A-6B. For the implementation using the bulk substrate 10b, an oxide material 36 is deposited on the wafer to a height which exceeds the height of the silicon-covered fins 12. The material 36 may be planarized using a chemical-mechanical polishing (CMP) process. A recessing process is then performed to selectively remove an upper portion of the oxide material 36 and thus reveal an upper portion 12u of each fin 12. The portion of oxide material 36 which remains after the recessing process is completed serves to insulate between adjacent fins 12 in the bulk substrate implementation. The exposed upper portion 12u of each fin 12 may, for example, have a height "h1" of 30-50 nm. Although not show in FIGS. 6A-6B, the material 36 is also provided to insulate between fins made of other semiconductor materials, such as with the silicon fins.

While a preferred implementation grows the layer 34 before formation of the oxide material 36, in an alternative implementation the oxide material may be formed first followed by the epitaxial growth of the layer 34 on the exposed upper portion 12u of the fins 12.

The epitaxial growth layer 34 provided to cover the silicon-germanium fins 12 (but notably is not present on other fins such as the silicon fins), advantageously provides a protective barrier layer to resist against undesired SiGe material consumption during subsequent steps of the integrated circuit fabrication process. For example, the epitaxial growth layer 34 protects the SiGe fins 12 against erosion during the standard wet clean process (referred to by those skilled in the art as "SC1") utilized in semiconductor manufacturing. So, the width "w" of the fins 12 will remain consistent in the region and further substantially equal, if desired, the width of fins in other areas of the substrate which are made of materials other than silicon-germanium.

This permits the use of the standard SC1 clean and obviates the need for use of a special clean.

Figure 7A:
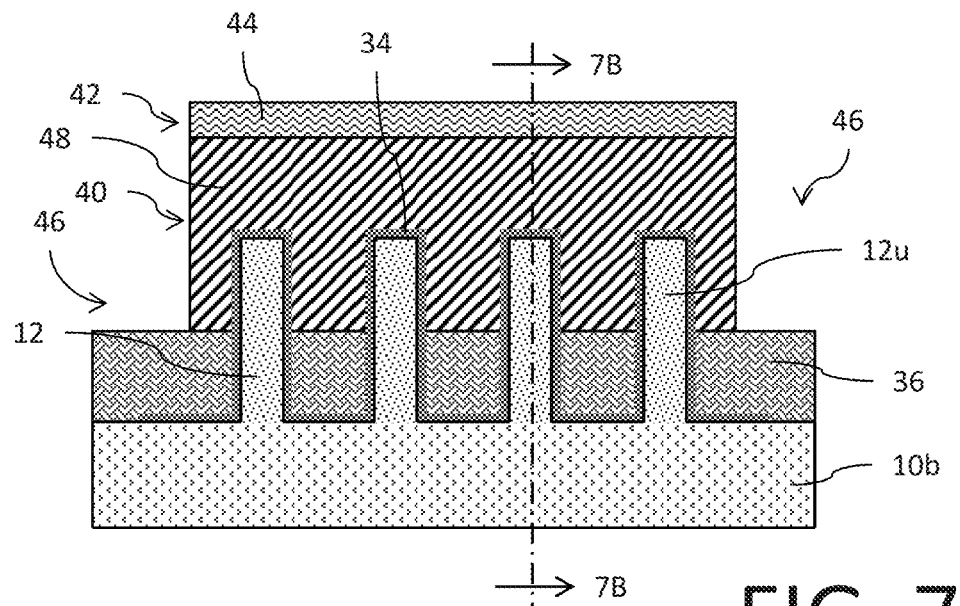
Figure 7B:
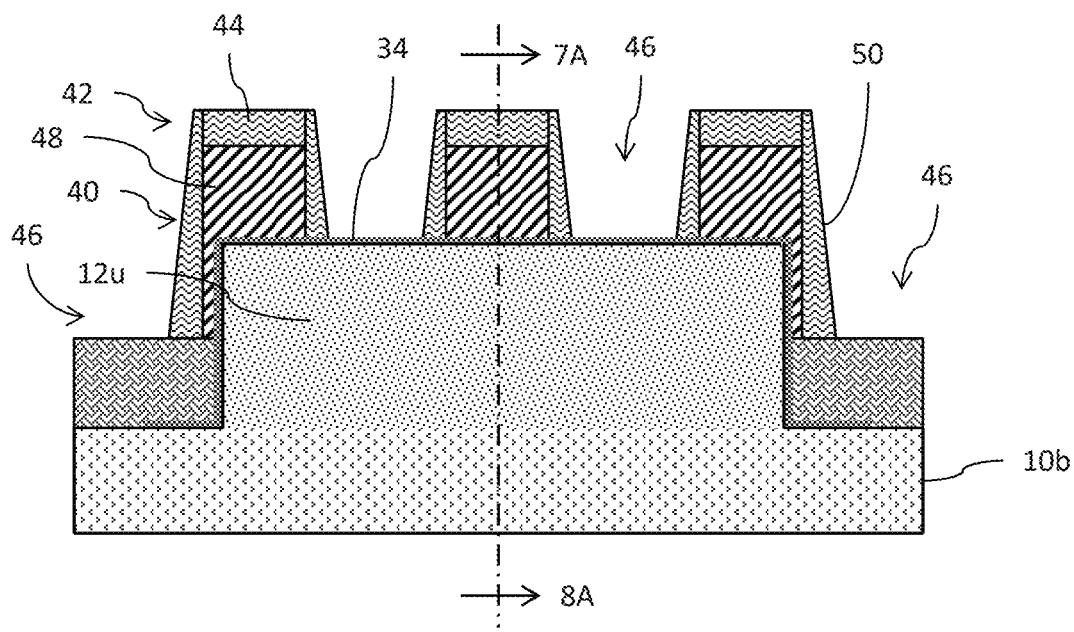
Figure 7C:
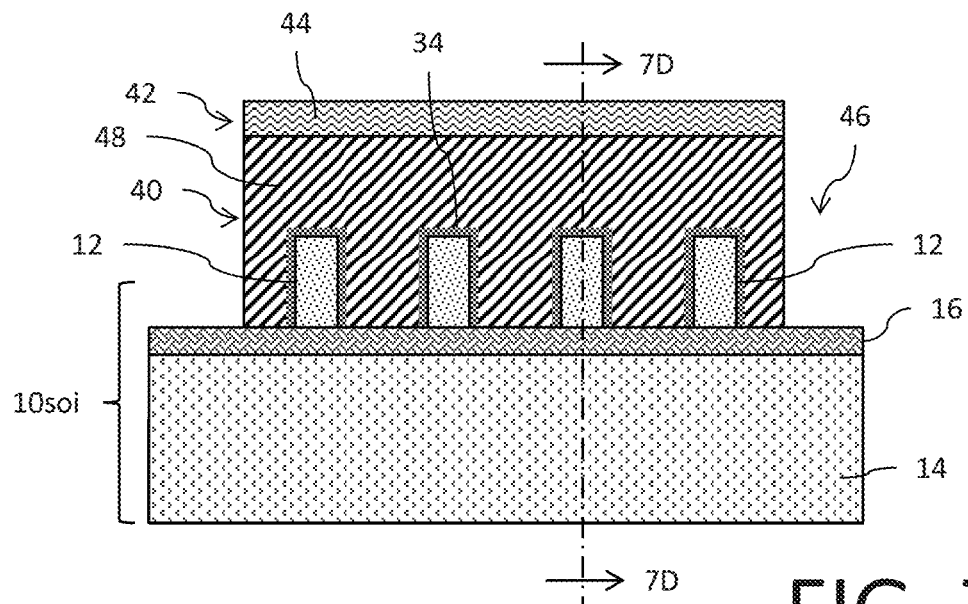
Figure 7D:
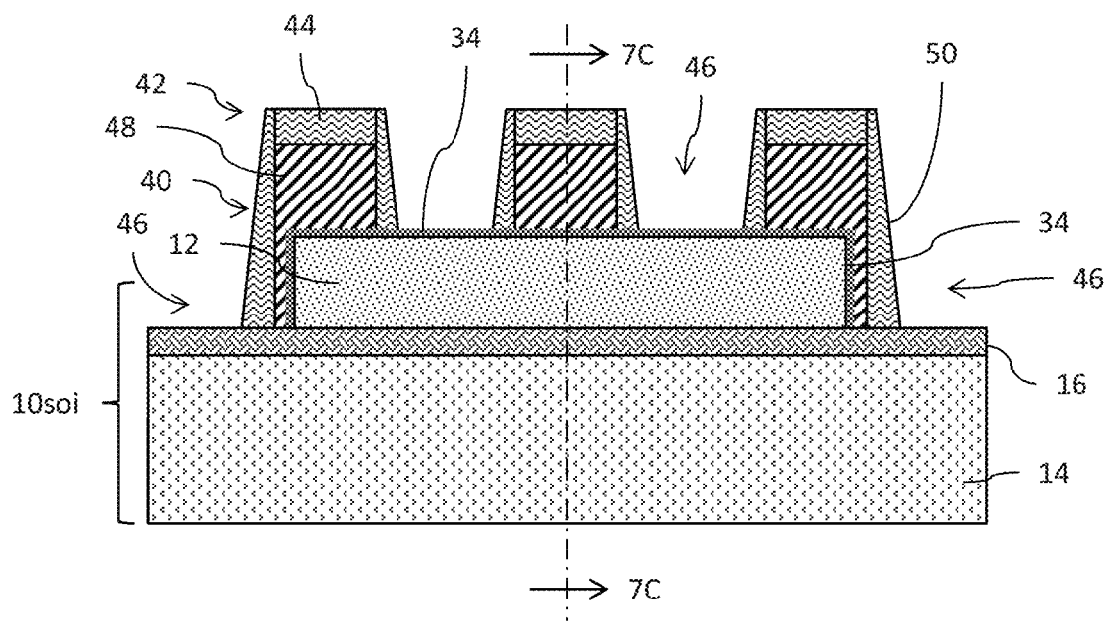

Reference is now made to FIGS. 7A-7D (wherein FIGS. 7A-7B refer to the implementation on the bulk substrate 10b and FIGS. 7C-7D refer to the implementation on the SOI substrate 10soi). A sacrificial polysilicon material 40 is deposited using a conventional chemical vapor deposition (CVD) process on the substrate 10 to cover the fins 12 (and the epitaxial growth 34 layer). The polysilicon material 40 may, in an alternative implementation, instead comprise amorphous silicon. A conformal oxide (not explicitly shown) may be formed on the exposed surfaces of the fins 12 prior to deposition of the polysilicon material 40. As understood by those skilled in the art, the polysilicon material (with the oxide) is associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). Thus, there is no need to dope the polysilicon material 40. The deposit of the polysilicon material 40 will have a height in excess of the height of the fins 12 so that the fins will be completely covered. The material 40 may have a thickness, for example, of 50-150 nm. The top surface of the polysilicon material 40 deposit is planarized using conventional chemical-mechanical polishing (CMP) techniques to provide a planar top surface.

A hard mask layer 42 with a thickness of 30-60 nm is deposited on the planar top surface of the polysilicon material 40 using a chemical vapor deposition (CVD) process. The layer 42 is lithographically patterned in a manner well known to those skilled in the art to leave mask material 44 at desired locations for the dummy gate structures. A reactive ion etch (RIE) is then performed to open apertures 46 in the polysilicon material on either side of the dummy gate 48. The structure of the dummy gate 48 may be considered to straddle over a fin 12, or over a plurality of adjacent fins, at a channel region (see, FIGS. 7A and 7C).

A silicon nitride material is then conformally deposited, for example, using an atomic layer deposition (ALD) technique as known in the art, and subsequently etched preferentially on the horizontal surfaces to leave sidewall spacers 50 on the side walls of the polysilicon dummy gates 48 (see, FIGS. 7B and 7D).

The dummy gate structure accordingly comprises a patterned polysilicon (or amorphous silicon) dummy gate 48, an overlying silicon nitride cap (formed by the mask material 44) and sidewall spacers 50.

It will be noted in FIGS. 7B and 7D that dummy gate structures have also been formed at the ends of the fin 12 in accordance with the known technique of gate tuck-under. Without this structure, the subsequent formation of raised source/drain structures (described below) could result in epitaxial growth in an outward direction resulting in an increased risk of shorting to an adjacent structure. Additionally, these end structures ensure better quality and consistency of epitaxial growth which may exhibit a non-uniform growth at the ends of the fin in the absence of the end structures.

Figure 8A:
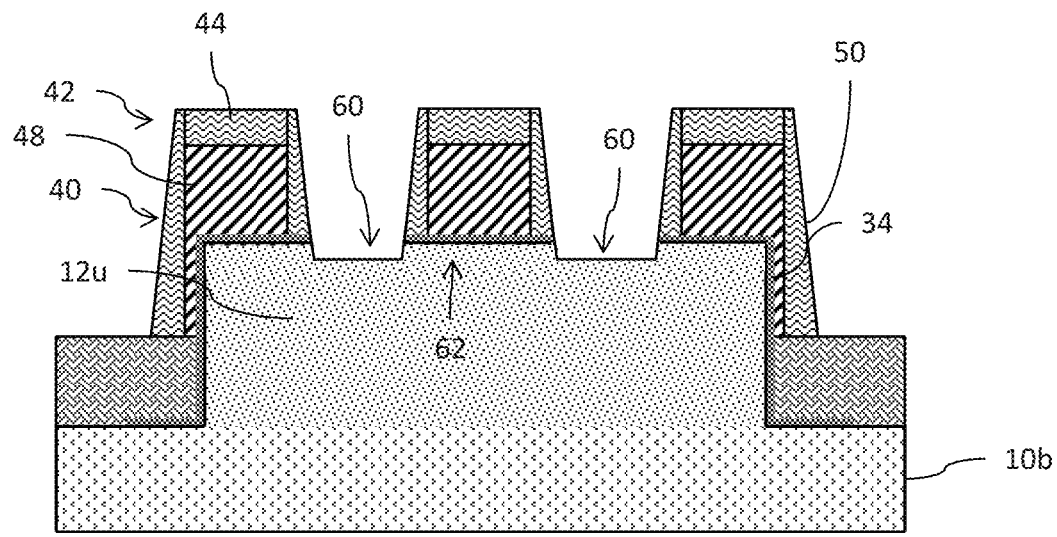
Figure 8B:
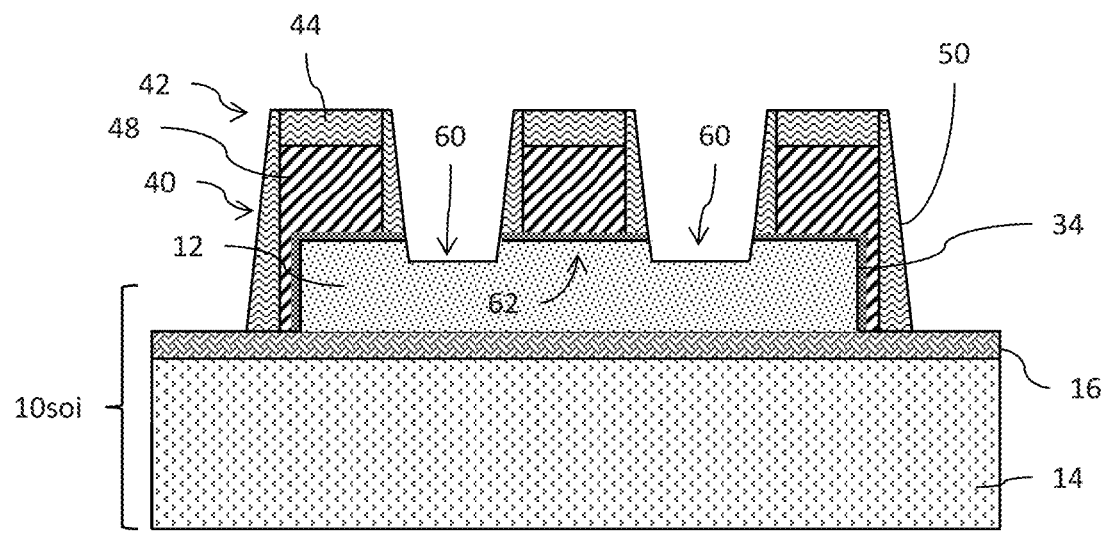

Reference is now made to FIGS. 8A-8B (wherein FIG. 8A refers to the implementation on the bulk substrate 10b and FIG. 8B refers to the implementation on the SOI substrate 10soi). An etch is then performed to recess 60 the fins 12 on either side of the dummy gate structures. The etch may, for example, comprise an anisotropic (HBr) etch. The depth of the recess 60 may, for example, comprise 20-40 nm. The portion 62 of the fin 12 located under the dummy gates 48 between the recess 60 regions defines a channel region of the FinFET transistor.

The amount of the depth for the recess 60 may matter in some applications. The deeper the depth, the closer the resulting in situ doped source/drain region can get to the channel region 62 so as to form a more abrupt junction. However, if a strained channel material is used, the deeper the depth the more of the material that is cut from the fin 12 which can lead to a reduction in the applied strain on the channel. So, selection of the depth is an important consideration for the transistor designer so as to balance between junction design and strain retention. Thus, it will be understood that the illustration of the depth in FIGS. 8A-8B is an example of a depth chosen in accordance with this balancing evaluation.

Figure 9A:
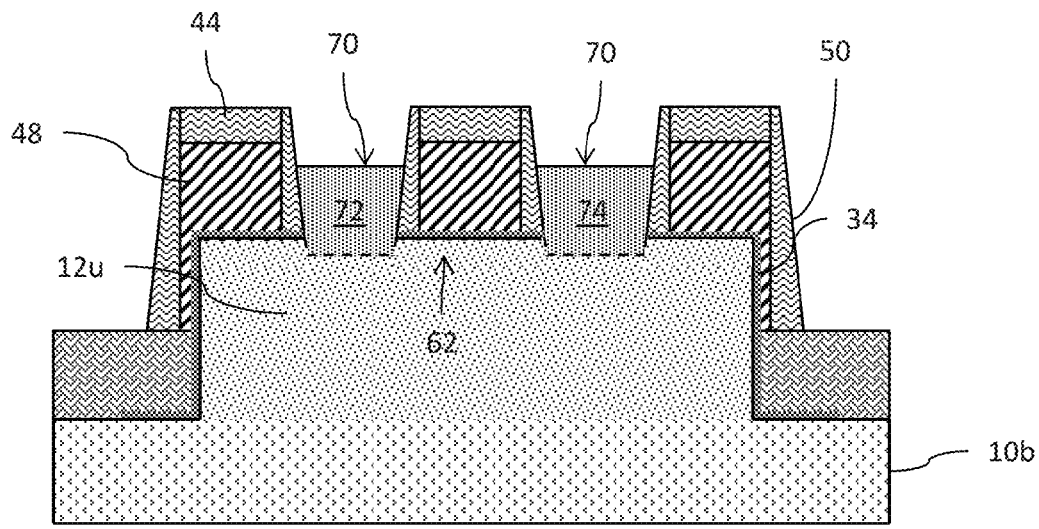
Figure 9B:
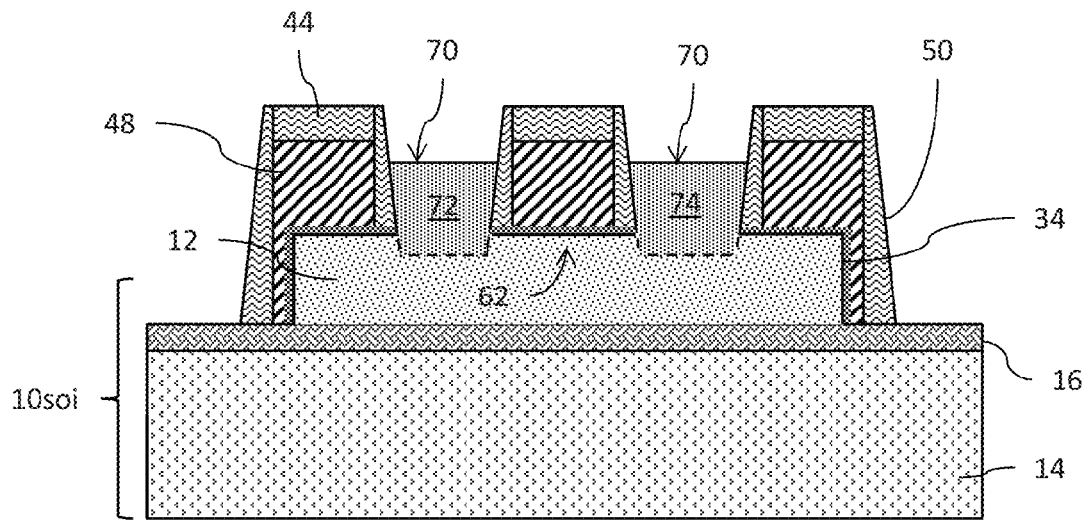

Using an epitaxial process tool and starting from the exposed top surface of the fins 12 in the recess 60 region, an epitaxial growth 70 of a silicon-based semiconductor material is made. The epitaxial growth 70 not only fills the recess 60 regions (adjacent the channel portion 62) but further extends above the previous top surface of the fins to regions adjacent the sidewall spacers 50 on either side of the dummy gate structures. The silicon-based epitaxial growth 70 may be in situ doped as needed for a given application. As a result of the epitaxial growth 70, raised source and drain regions 72 and 74, respectively, are formed on either side of the dummy gate structures. The result is shown in FIGS. 9A-9B (wherein FIG. 9A refers to the implementation on the bulk substrate 10b and FIG. 9B refers to the implementation on the SOI substrate 10soi). The epitaxial growth 70 may comprise, for example: silicon doped with arsenic or phosphorus; silicon-germanium doped with boron or indium; or silicon-carbide doped with arsenic or phosphorus. The doping concentration may comprise, for example, $1 \times 10^{20}$ to $1 \times 10^{21}$ at·cm$^{-3}$.

The benefit of the recess 60 performed before epitaxial growth of the raised source/drain structures is to provide the raised source/drain structures with closer proximity to the channel region 62. This supports better strain control and a more uniform doping profile.

Figure 10A:
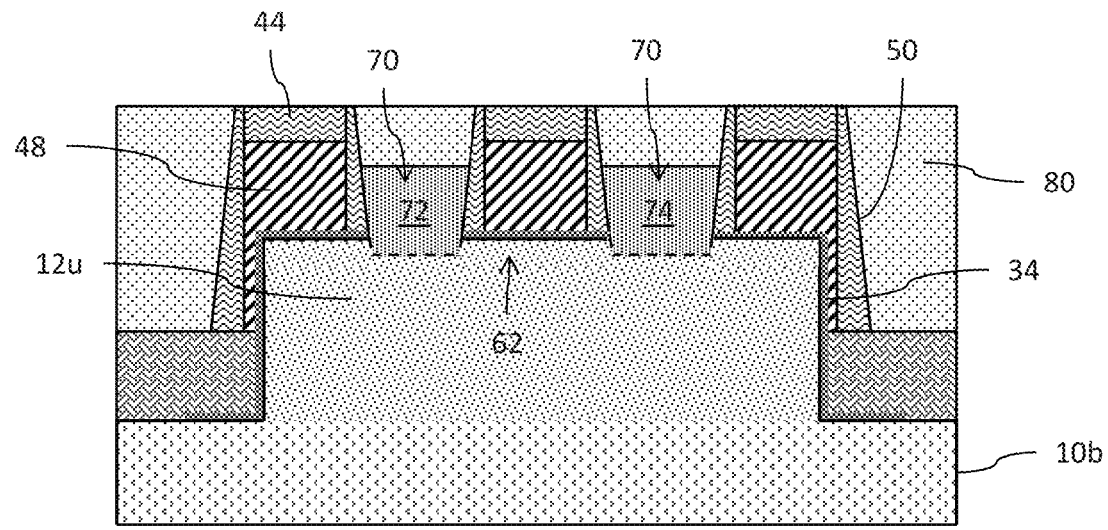
Figure 10B:
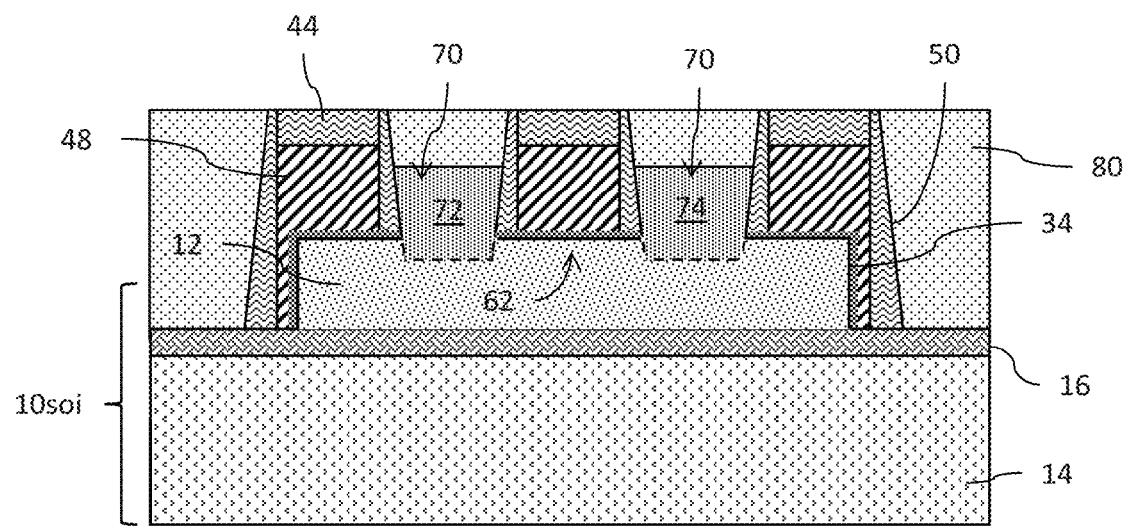

Reference is now made to FIGS. 10A-10B (wherein FIG. 10A refers to the implementation on the bulk substrate 10b and FIG. 10B refers to the implementation on the SOI substrate 10soi). A silicon dioxide material 80 is deposited to cover the substrate. The material 80 may be further processed using conventional chemical-mechanical polishing (CMP) techniques to provide a planar top surface that stops at the top of each dummy gate structure.

Figure 11A:
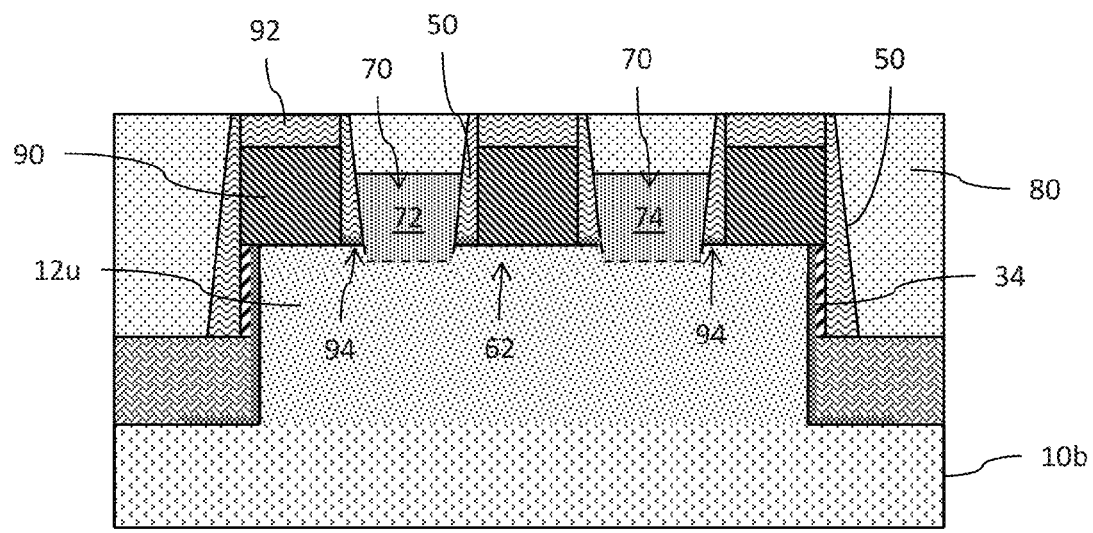
Figure 11B:
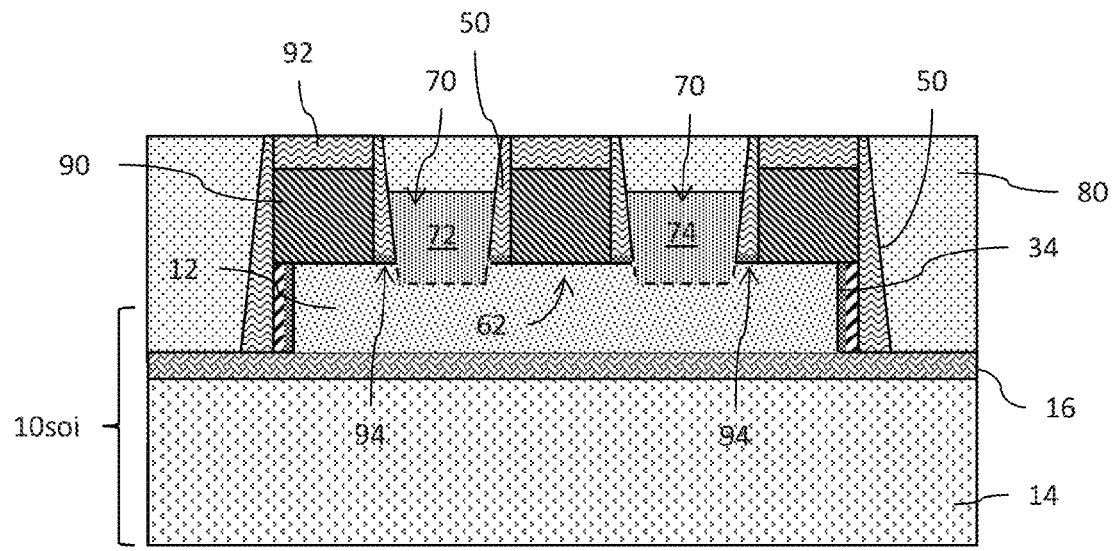

Using a selective removal process (such as an ammonium hydroxide etch), the dummy gates 48 are removed. In particular, the cap 44 and the portion of the epitaxial growth layer 34 immediately underneath the dummy gates 48 are also removed. The epitaxial growth layer 34 may, for example, be removed using a standard wet clean process (referred to by those skilled in the art as "SC1"). Portions 94 of the epitaxial growth layer 34 will, however, remain in place underneath the sidewall spacers 50. The removed dummy gates 48 are then replaced with a metal gate structure 90. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. An insulating cap 92 covers the metal gate structure 90. The result is shown in FIGS. 11A-11B (wherein FIG. 11A refers to the implementation on the bulk substrate 10b and FIG. 11B refers to the implementation on the SOI substrate 10soi).

Further processing well known to those skilled in the art is then performed to produce the metal contacts to the gate (metal gate structure 90), source region 72 and drain region 74. For example, additional silicon dioxide material may be deposited to complete the formation of a pre-metallization dielectric (PMD) level for the integrated circuit. This material may be further processed using conventional chemical-mechanical polishing (CMP) techniques to provide a planar top surface. A hard mask layer, for example an organic planarization layer (OPL), is then deposited on the planar top surface of the PMD layer using a coating process. The OPL is then lithographically patterned in a manner well known to those skilled in the art to form openings at desired locations for making electrical contact to the gate, source region and drain region. A reactive ion etch (RIE) is then performed to open and extend apertures completely through the pre-metallization dielectric (PMD) to expose a top surface of the gate metal and the epitaxial growth of the source and drain regions. The OPL is then removed. The apertures are then filled with metal material(s) to define a contact made to each of the gate, source region and drain region of the transistor. As necessary, a conventional chemical-mechanical polishing (CMP) technique may be used to remove excess metal so as to provide a planar top surface. The metal materials defining the contacts may, for example, comprise tungsten deposited using a chemical vapor deposition process. The fabrication process is compatible with the formation of a silicide at the bottom of the source and drain contacts. The techniques for salicidation are well known to those skilled in the art. The silicide may, for example, comprise a typical nickel platinum silicide or alternatively a silicide arising from the use of a titanium nitride liner for the contact.

At this point, front end of line (FEOL) fabrication of the integrated circuit is complete. Further back end of line (BEOL) processing to fabricate metallizations and interconnects may then be performed as well known to those skilled in the art.

Figure 12A:
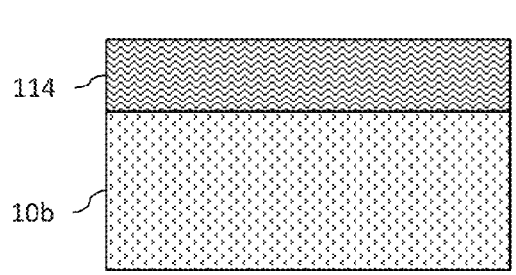
FIGS. 12A-12H show a process for fin fabrication with a bulk substrate.
Figure 12B:
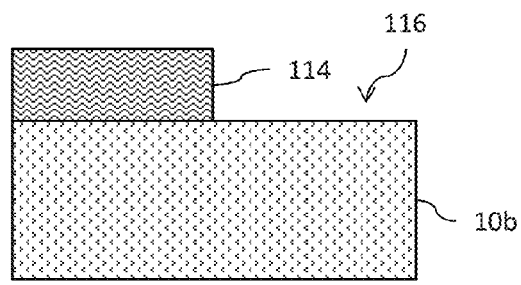
Figure 12C:
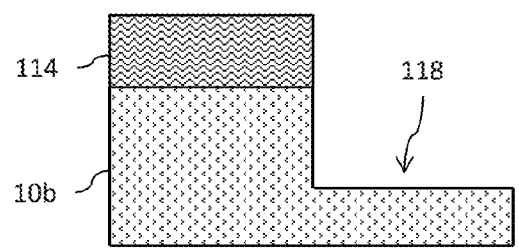
Figure 12D:
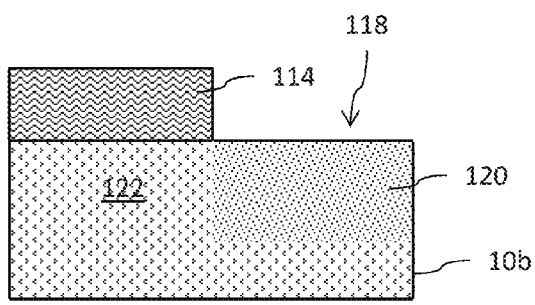
Figure 12E:
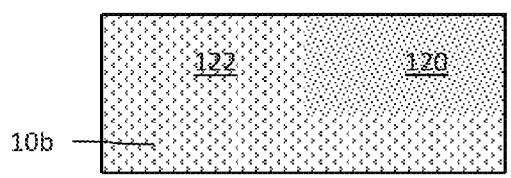
Figure 12F:
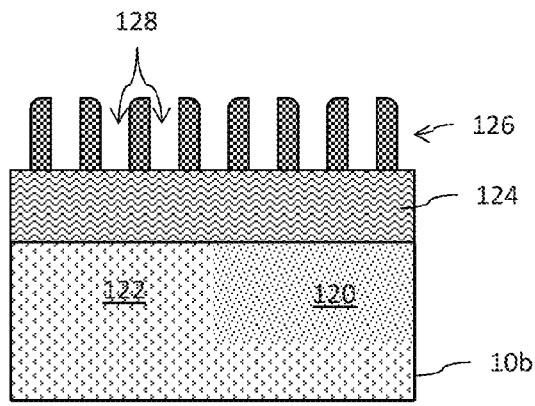
Figures 12G, 12H:
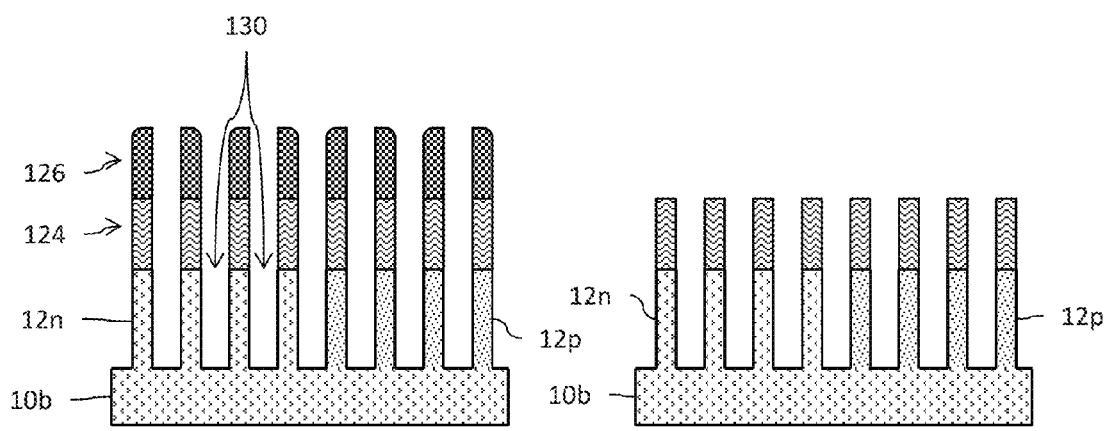

An example of a process for fin 12 fabrication with a bulk substrate 10b is shown in FIGS. 12A-12H. It will be understood that the illustrations provided do not necessarily show the features drawn to scale. In FIG. 12A, a hard mask layer 114 (for example, of silicon nitride SiN) is deposited on the substrate 10b which is formed of silicon material. Using a conventional lithographic patterning technique, the layer 114 is patterned to form mask openings 116 over areas of the wafer where p-channel devices are desired to be formed as shown in FIG. 12B. A reactive ion etch (RIE) process is then performed through the openings 116 to remove a desired portion of the substrate 10b as shown in FIG. 12C and form apertures 118. An epitaxial process is then used to epitaxially grow silicon-germanium material 120 in the aperture 118 (at least to a same height as the silicon material 122 of the substrate 10b) as shown in FIG. 12D. The remainder of the hard mask layer 114 is removed and a planarization process, for example comprising chemical mechanical polishing (CMP), is performed to provide a planar top surface as shown in FIG. 12E. A hard mask layer 124 (for example, of silicon nitride SiN) is then deposited. Over the hard mask layer 124, a lithographically patterned mask 126 is formed. The mask 126 includes a number of mask openings 128 with the lithographic patterning leaving mask material at locations where fins 12 are desired. The result is shown in FIG. 12F. An etching operation is then performed through the openings 128 as shown in FIG. 12G to define a plurality of apertures 130 in the materials 120 and 122 that define the fins 12 (which include fins 12n made of silicon material 122 and fins 12p made of silicon-germanium material 120). The lithographically patterned mask 126 is then removed as shown in FIG. 12H. The structure is now ready for processing starting at FIGS. 2A-2B as discussed above. With reference once again to FIG. 4A, the mask 30 would be provided to cover the fins 12n, with the opening 32 provided over the fins 12p.

Figures 13A, 13B:
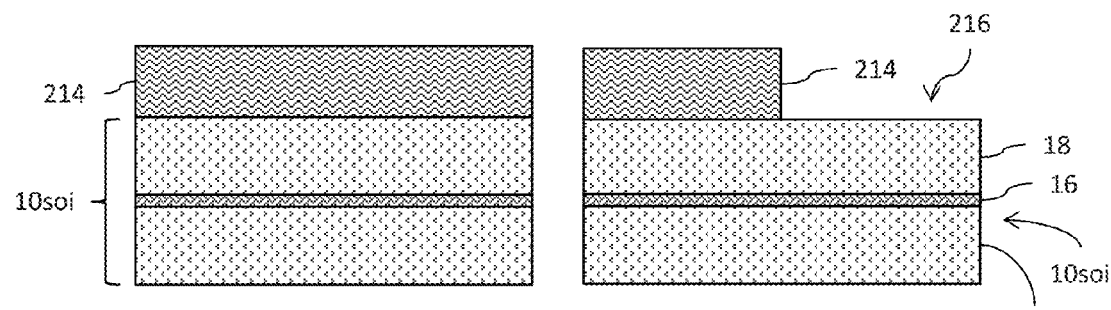
FIGS. 13A-13J show a process for fin fabrication with an SOI substrate.
Figures 13C, 13D:
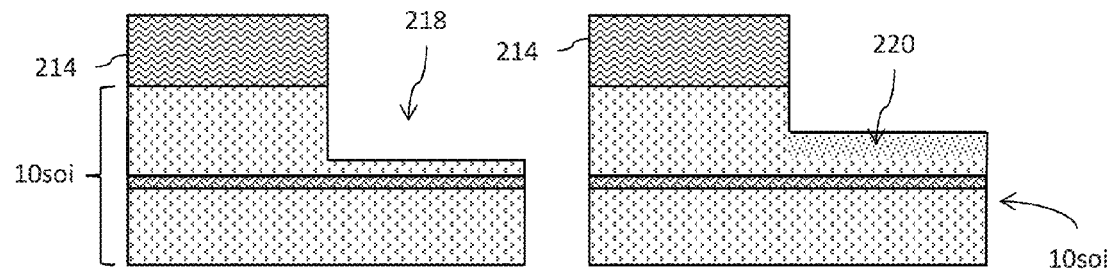
Figure 13E:
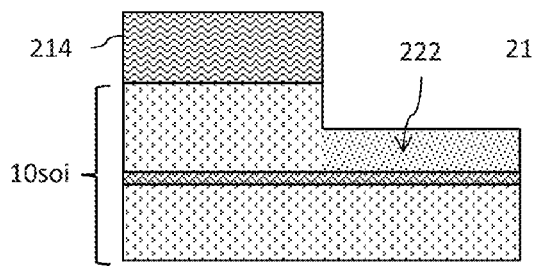
Figure 13F:
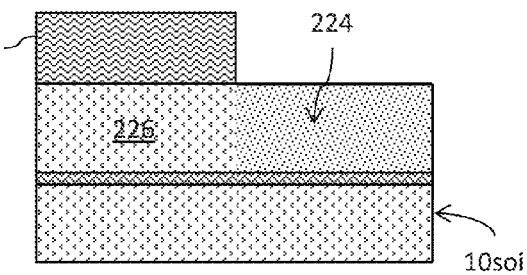
Figure 13G:
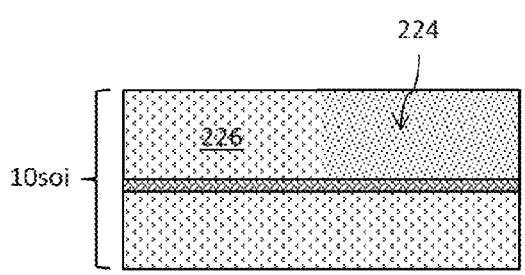
Figure 13H:
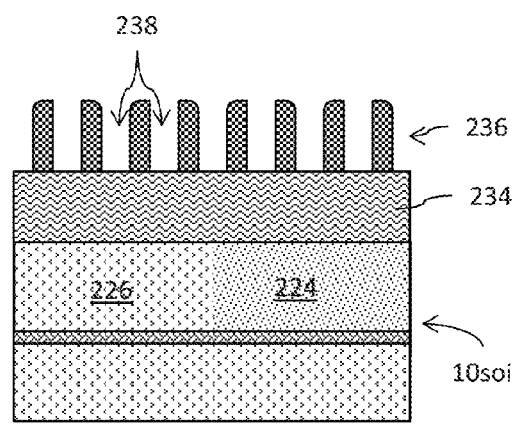
Figure 13I:
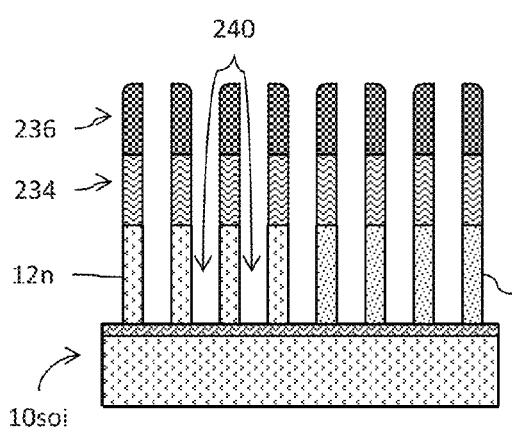
Figure 13J:
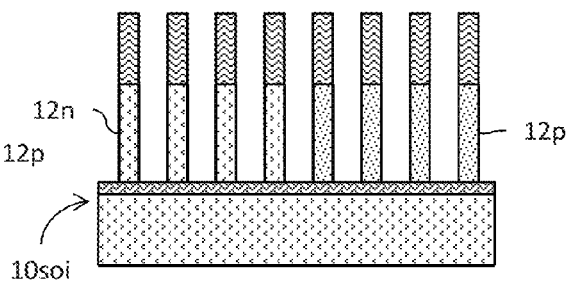

An example of a process for fin 12 fabrication with an SOI-type substrate 10soi is shown in FIGS. 13A-13J. It will be understood that the illustrations provided do not necessarily show the features drawn to scale. In FIG. 13A, a hard mask layer 214 (for example, of silicon nitride SiN) is deposited on the substrate 10soi on top of silicon material layer 18. Using a conventional lithographic patterning technique, the layer 214 is patterned to form mask openings 216 over areas of the wafer where p-channel devices are desired to be formed as shown in FIG. 13B. A reactive ion etch (RIE) process is then performed through the openings 216 to remove a desired portion (but less than all) of the top silicon layer 18 as shown in FIG. 13C and form apertures 218. An epitaxial process is then used to epitaxially grow silicon-germanium material 220 at the bottom of the aperture 218 as shown in FIG. 13D. A thermal condensation process is then performed to convert the semiconductor material areas of the wafer layer 18 where p-channel devices are desired to be formed to a silicon-germanium region 222 as shown in FIG. 13E. An epitaxial process is then used to epitaxially grow silicon-germanium material 224 from the region 222 (at least to a same height as the silicon material 226 of the substrate 10soi layer 18) as shown in FIG. 13F. The remainder of the hard mask layer 214 is removed and a planarization process, for example comprising chemical mechanical polishing (CMP), is performed to provide a planar top surface as shown in FIG. 13G. A hard mask layer 234 (for example, of silicon nitride SiN) is then deposited. Over the hard mask layer 234, a lithographically patterned mask 236 is formed. The mask 236 includes a number of mask openings 238 with the lithographic patterning leaving mask material at locations where fins 12 are desired. The result is shown in FIG. 13H. An etching operation is then performed through the openings 238 as shown in FIG. 13I to define a plurality of apertures 240 in the materials 224 and 226 that define the fins 12 (which include fins 12n made of silicon material 226 and fins 12p made of silicon-germanium material 224). The lithographically patterned mask 236 is then removed as shown in FIG. 13J. The structure is now ready for processing starting at FIGS. 3A-3B as discussed above. With reference once again to FIG. 4B, the mask 30 would be provided to cover the fins 12n, with the opening 32 provided over the fins 12p.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method for manufacturing a FinFET transistor, comprising:
    forming a fin of silicon-germanium semiconductor material;
    forming a layer of silicon material on surfaces of said fin;
    forming a transistor gate structure that extends over a channel region of said fin;
    forming sidewall spacers on each side of the transistor gate structure, wherein a bottom of each sidewall spacer is separated from a top surface of said fin by said layer of silicon material;
    forming recessed regions at a top of the fin adjacent the channel region on each side of the transistor gate electrode; and
    epitaxially growing epitaxial growth material from said fin to fill the recessed regions and form raised source and drain regions.

2. The method of claim 1, wherein forming the transistor gate structure comprises forming a dummy gate structure over the layer of silicon material and then forming said sidewall spacers;
    the method further comprising:
        removing the dummy gate structure after the step of epitaxially growing;
        removing a portion of the layer of silicon material located underneath the dummy gate structure; and
        replacing the removed dummy gate structure and removed portion of the layer of silicon material with a metal gate electrode.

3. The method of claim 1, wherein the step of forming the fin comprises forming the fin on a substrate, wherein the substrate is a bulk substrate.

4. The method of claim 1, wherein the step of forming the fin comprises forming the fin on a substrate, wherein the substrate is a silicon on insulator (SOI) substrate.

5. The method of claim 1, wherein the step of forming the layer of silicon material comprises epitaxially growing the layer of silicon material on the top surface of said fin and on side surfaces of said fin.

6. The method of claim 1, wherein the step of forming recessed regions comprises removing portions of said layer of silicon material from the top surface of the fin on each side of the sidewall spacers.

7. The method of claim 1, further comprising performing a cleaning operation, wherein said layer of silicon material protects said fin from erosion during said cleaning operation.

8. The method of claim 1, wherein the step of forming sidewall spacers comprises:
    conformally depositing a spacer material on the transistor gate structure;
    etching the spacer material to define the sidewall spacers; and
    performing a cleaning operation, wherein said layer of silicon material protects said fin from erosion during said cleaning operation.

9. A method, comprising:
    forming a first fin of first semiconductor material and a second fin of second semiconductor material that is different from the first semiconductor material;
    covering said first fin with a mask having an opening exposing said second fin;
    epitaxially growing a layer of silicon material on exposed surfaces of said second fin;
    forming a dummy transistor gate that extends over a channel region of said second fin;
    forming sidewall spacers on each side of the dummy transistor gate and directly on top of said layer of silicon material;
    removing portions of said layer of silicon material on each side of the dummy transistor gate adjacent the sidewall spacers;
    forming recessed regions in a top surface of the fin where the portions of said layer of silicon material were removed;
    epitaxially growing raised source and drain regions in said recessed regions;
    removing the dummy transistor gate;
    removing another portion of said layer of silicon material underneath said dummy transistor gate; and
    installing a replacement metal gate between the sidewall spacers.

10. The method of claim 9, wherein the first semiconductor material is silicon and the second semiconductor material is silicon-germanium.

11. The method of claim 10, wherein the silicon-germanium material has a germanium content in excess of 25%.

12. The method of claim 9, wherein the step of forming the first and second fins comprises forming the first and second fins on a substrate, wherein the substrate is a bulk substrate.

13. The method of claim 9, wherein the step of forming the first and second fins comprises forming the first and second fins on a substrate, wherein the substrate is a silicon on insulator (SOI) substrate.

14. The method of claim 9, wherein the first semiconductor material is silicon and the second semiconductor material is silicon-germanium, further comprising performing a cleaning operation, wherein said layer of silicon material protects the silicon germanium material of said second fin from erosion during said cleaning operation.

15. The method of claim 9, wherein the step of forming sidewall spacers comprises:
    conformally depositing a spacer material on the dummy transistor gate;
    etching the spacer material to define the sidewall spacers; and
    performing a cleaning operation, wherein said layer of silicon material protects said second fin from erosion during said cleaning operation.

16. A method, comprising:
    forming a fin of silicon-germanium material;
    epitaxially growing a layer of silicon material on surfaces of said fin;
    forming a dummy transistor gate to extend over a channel region of said fin;
    forming sidewall spacers on each side of the dummy transistor gate, said sidewall spacers is direct contact with a top of the layer of silicon material;
    epitaxially growing raised source and drain regions from said fin on each side of the dummy transistor gate adjacent the sidewall spacers;
    removing the dummy transistor gate and a portion of the epitaxial silicon layer underneath said dummy transistor gate; and
    installing a replacement metal gate between the sidewall spacers.

17. The method of claim 16, further comprising performing a cleaning operation, wherein said layer of silicon material protects said silicon-germanium fin from erosion during said cleaning operation.

18. The method of claim 16, wherein the silicon-germanium material has a germanium content in excess of 25%.

19. The method of claim 16, wherein the step of forming the fin comprises forming the fin on a substrate, wherein the substrate is a bulk substrate.

20. The method of claim 16, wherein the step of forming the fin comprises forming the fin on a substrate, wherein the substrate is a silicon on insulator (SOI) substrate.

21. A method, comprising:
   forming a fin of silicon-germanium material;
   epitaxially growing a layer of silicon material on surfaces of the fin;
   forming a dummy transistor gate structure to extend over a channel region of the fin, the dummy transistor gate structure including a dummy gate;
   forming a gate electrode recess by removing the dummy gate and a portion of the epitaxial layer of silicon material underneath the dummy gate; and
   installing a replacement metal gate structure over the channel region of the fin in the gate electrode recess.

* * * * *